United States Patent [19]

Jasper et al.

[11] Patent Number: 5,396,656
[45] Date of Patent: Mar. 7, 1995

[54] METHOD FOR DETERMINING DESIRED COMPONENTS OF QUADRATURE MODULATED SIGNALS

[75] Inventors: Steven C. Jasper, Hoffman Estates; Mark A. Birchler, Roselle, both of Ill.

[73] Assignee: Motorola, Inc., Schaumburg, Ill.

[21] Appl. No.: 116,174

[22] Filed: Sep. 2, 1993

[51] Int. Cl.⁶ ............................................. H04B 1/16
[52] U.S. Cl. ..................................... 455/295; 455/63; 455/303; 375/235; 375/261; 375/349
[58] Field of Search ................. 455/63, 295, 296, 302, 455/303, 305; 375/15, 39, 58, 97, 98, 99, 102

[56] References Cited

U.S. PATENT DOCUMENTS

| | | | |
|---|---|---|---|
| 4,899,367 | 2/1990 | Sampei | 375/39 |
| 5,245,611 | 9/1993 | Ling et al. | 375/15 X |
| 5,263,196 | 11/1993 | Jasper | 455/305 X |

*Primary Examiner*—Reinhard J. Eisenzopf
*Assistant Examiner*—Chi H. Pham
*Attorney, Agent, or Firm*—Daniel C. Crilly; James A. Coffing

[57] ABSTRACT

In the following manner, a receiver that receives quadrature modulated signals may determine desired components of the quadrature modulated signals by minimizing effects of transmitted distortion produced by gain, phase, or gain-phase imbalance. A quadrature modulated signal that includes a desired component, a fading component, and a transmitter distortion component is received by the receiver, wherein the transmitter distortion component includes a conjugate component and an imbalance component. The receiver estimates the fading component, the conjugate component, and the imbalance component and determines the desired component based on these estimates and the quadrature modulated signal.

12 Claims, 3 Drawing Sheets

METHOD FOR DETERMINING DESIRED COMPONENTS OF QUADRATURE MODULATED SIGNALS

Field of the Invention

The present invention relates generally to radio communication systems and, in particular, to a radio communication system that utilizes quadrature modulated signals.

Background of the Invention

As is known, communication systems include transmitters and receivers that are tuned to transceive information. In such systems, a transmitter modulates a baseband information signal and upconverts it to a radio frequency (RF) carrier. The transmitter then amplifies and transmits the RF carrier via an antenna and an RF channel to the receiver's antenna. Upon reception, the receiver down-converts and demodulates the received signal to reproduce the original information signal.

There are a variety of methods for modulating (demodulating) and upconverting (down-converting) baseband information signals. One such method utilizes quadrature modulated signals. Quadrature modulation in the transmitter is generally accomplished by first generating two independent baseband signals. These independent signals are generally referred to as the I, or in-phase, component and the Q, or quadrature, component. Upon generation of the I and Q components, each component subsequently experiences a separate frequency upconversion. The two upconversions are related in that both upconvert their respective component to the same RF carrier frequency and provide ideally identical magnitude gain; however, the phases of the two local oscillator upconverting signals ideally differ by 90 degrees. Therefore, once the upconversions have occurred, a quadrature modulated signal is generated by summing the upconverted I and Q components. In a similar, but reciprocal manner, the receiver down-converts and demodulates its received quadrature modulated signal.

Upconverting two baseband signals to precisely the same RF carder frequency is a known procedure; however, attaining the ideal phase difference between the local oscillator upconverting signals and providing identical gain of the I and Q component magnitudes are much more difficult principles to realize in practice. Deviations from the ideal phase difference and magnitude gain produced during quadrature modulation are commonly referred to as phase and gain imbalances. For example, when the phases of the local oscillator upconverting signals differ by 89 degrees, a phase imbalance of 1 degree occurs. Likewise, when the magnitude gains provided by the two separate upconversions differ by 1 dB, a 1 dB gain imbalance exists.

Ideally, there is no gain or phase imbalance between the I and the Q component upconverters during quadrature modulation. However, due to the limitations of present technology, an imbalance occurs. The imbalance between the I component and the Q component can be more fully described with reference to FIGS. 1 and 2. FIG. 1 illustrates a transmitter 100 that provides quadrature modulation prior to transmission. The transmitter includes a digital signal processor (DSP) 101 that produces in-phase (I) and quadrature (Q) signal components 102–103, digital-to-analog converters 104–105, lowpass filters (LPFs) 106–107, mixers 108–109, gain stages 112–113, a summer 114, a power amplifier (PA) 115, and an antenna 116. As is known, the gain of each gain stage 112–113 and the phase shift of each local oscillator 110–111 are not balanced due to inconsistencies in the analog devices utilized to implement them.

To demonstrate how gain, phase, or gain-phase imbalances produce distortion of a quadrature modulated signal, consider the following example. Let $x_I(t)$ 118 be the input to the cosine mixer 108 and $x_Q(t)$ 119 be the input to the sine mixer 109. For convenience, regard these two inputs 118–119 as constituent parts of a single complex signal x(t). Thus, $x(t) = x_I(t) + j\, x_Q(t)$. By using known complex arithmetic, an expression for a signal s(t) 117 at the output of the summer 114 may be mathematically formulated as:

$$s(t) = [R\{[x(t)(a + a'e^{j\phi}) + x^*(t)(a - a'e^{j\phi})]e^{j\omega_c t}\}]/2$$

where $x^*(t)$ denotes the complex conjugate of x(t), $R\{\}$ denotes the real part of a complex quantity contained in the brackets, $\phi$ is the phase imbalance between the two mixers 108–109, $\omega_c$ is the radian RF carrier frequency, a is the gain of the gain stage 112 in the I component's upconversion, and a' is the gain of the gain stage 113 in the Q component's upconversion. Thus, in the formulated expression for s(t), the information portion comprises x(t) scaled by the quantity $(a + a'e^{j\phi})$ and the distortion portion comprises $x^*(t)$ scaled by the quantity $(a - a'e^{j\phi})$. Therefore, the distortion is directly related to the phase imbalance and the magnitude gain of each component's upconversion. Note that when $a = a'$ and $\phi = 0$ (i.e. the ideal case without gain or phase imbalance), the distortion term is scaled by zero and, consequently, disappears.

An alternative way to examine the distortion portion is to observe that the distortion portion is scaled with respect to the information portion by a factor $\gamma$, where $\gamma$ is defined as follows:

$$\gamma = (a - a'e^{j\phi}) / (a + a'e^{j\phi})$$

As is known, the Fourier Transform $\{X(f)\}$ of a conjugated complex signal is equal to the conjugated, frequency negated Fourier Transform of the original complex signal. That is when $x(t) \Leftrightarrow X(f)$, $x^*(t) \Leftrightarrow X^*(-f)$. Thus, the distortion portion's frequency content is equal to a conjugated, frequency-inverted replication of the information portion's frequency content scaled by the factor $\gamma$.

Distortion 201 & 206–209 portions of transmitted information signals produced by gain, phase, or gain-phase imbalance of the transmitter's quadrature modulator are illustrated in FIG. 2. In a single subchannel communication system (i.e. a system which transceives information using a single bandwidth information signal), the magnitude frequency response of the distortion portion 201 is simply the frequency-inverted and scaled magnitude frequency response of the information portion 200 as described above. However, the distortion portion degrades signal usability of the received information signal since it provides a form of self-interference which adds to the amount of interference and noise produced by the RF channel. As detailed in pending U.S. patent application serial number 08/069,927, entitled "A Method And Apparatus For Determining Signal Usability" and assigned to Motorola Inc., signal usability, or carrier-to-interference plus noise ratio, is adversely affected by increases in interference.

Alternatively, in a multiple subchannel communication system (i.e. a system which transceives information using multiple small bandwidth, or subchannel, information signals), the gain, phase, or gain-phase imbalance produced in the transmitter's quadrature modulator causes cross subchannel distortion 206–209, or interference. In this system configuration, as mathematically described above, each subchannel information signal 202–205 produces distortion 206–209 in a corresponding subchannel that is an equal, but opposite, frequency distance from the RF carrier center frequency ($\omega_c$). For example, the information signal 203 in subchannel one ($SC_1$) produces distortion 208 in subchannel two ($SC_2$) and vice versa. Similarly, the information signal in subchannel zero ($SC_0$) produces distortion 209 in subchannel three ($SC_3$) and vice versa.

Current art techniques neglect the transmitter's distortion component at the receiver since it produces a limited to negligible effect in low order digital modulation schemes, such as 8-ary quadrature amplitude modulation (QAM) and offset quaternary phase shift keying (OQPSK). Lower order modulation schemes are generally less susceptible to interference and noise than are higher order schemes, such as 16-ary QAM or 64-ary QAM. Thus, adding a small amount of additional interference in the form of distortion does not significantly impact the usability of the received lower order modulated signal. However, as the number of communication system users increases, thus necessitating improved spectral efficiency, the art will be driven to higher order modulation schemes in which the transmitter's distortion component has significant effect at the receiver.

Therefore, a need exists for a method that detects desired components of received quadrature modulated signals by minimizing effects of transmitter distortion due to gain, phase, or gain-phase imbalance produced by quadrature modulation of baseband information signals.

DESCRIPTION OF A PREFERRED EMBODIMENT

Generally, the present invention provides a method that determines desired components of received quadrature modulated signals by minimizing effects of transmitted distortion produced by gain, phase, or gain-phase imbalance. This is accomplished by receiving a quadrature modulated signal that includes a desired component, a fading component, and a transmitter distortion component, wherein the transmitter distortion component includes a conjugate component and an imbalance component. The receiver estimates the fading component, the conjugate component, and the imbalance component and determines the desired component based on these estimates and the quadrature modulated signal. Thus, distortion of the received quadrature modulated signal due to imbalances in the transmitter is substantially reduced such that the desired component is readily extracted.

Figure 3:
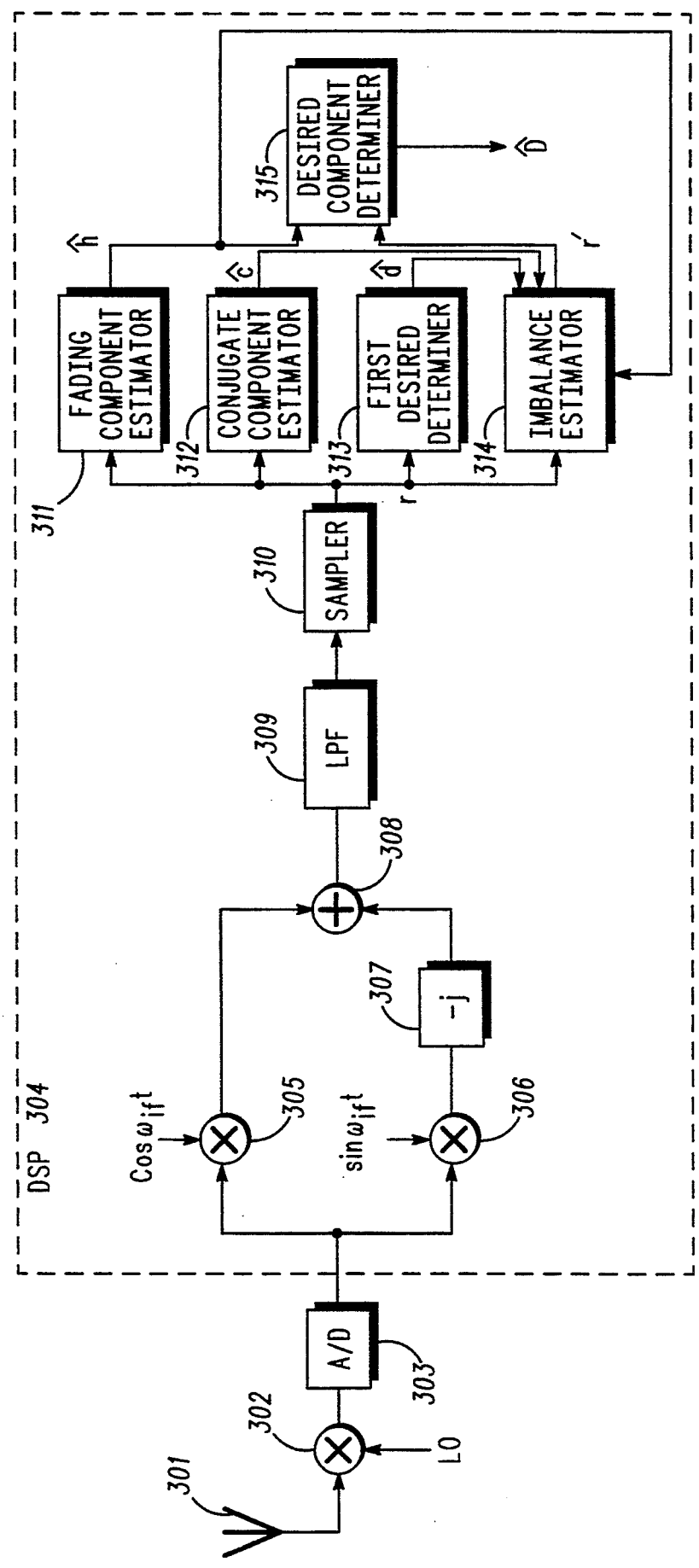
FIG. 3 illustrates a receiver in accordance with the present invention.

The present invention can be more fully described with reference to FIGS. 3 and 4. FIG. 3 illustrates a receiver 300 that includes an antenna 301, a mixer 302, an analog-to-digital (A/D) converter 303, and a digital signal processor (DSP) 304. The DSP 304 includes a complex down-converter comprising two mixers 305–306, a complex gain stage 307, and a complex summer 308, a lowpass filter (LPF) 309, a sampler 310, a fading component estimator 311, a conjugate component estimator 312, a first desired component determiner 313, an imbalance estimator 314, and a desired component determiner 315.

An incident quadrature modulated signal is received by the antenna 301 and down-converted to an intermediate frequency by the mixer 302. The quadrature modulated signal includes a desired component, a fading component, and a transmitter distortion component. The desired component provides the original transmitted information. The fading component is produced by effects of known fading in the radio frequency (RF) channel between the transmitter and receiver. The transmitter distortion component includes a conjugate component and an imbalance component, which together provide the effects of transmitter distortion due to gain, phase, or gain-phase imbalance. The output of the mixer 302 is converted to a digital signal by the A/D 303 and is supplied to the DSP 304. The DSP 304 provides a technologically preferred medium for processing a digital baseband representation of the received quadrature modulated signal to subsequently extract its desired component.

Upon entering the DSP 304, the digital signal is split and divided into quadrature components by the digital mixers 305–306. The digital mixers 305–306 down-convert their respective intermediate frequency inputs to in-phase and quadrature baseband components. The in-phase baseband component is provided directly to the complex summer 308, while the quadrature component is first scaled by the known complex constant ($-j$) 307 and subsequently supplied to the complex summer 308. The complex summer 308 sums the in-phase and scaled quadrature components to produce a complex baseband output signal. The lowpass filter 309 accepts the complex baseband output signal and performs functions such as signal band limiting and pulse shaping in order to minimize intersymbol interference. The sampler 310 receives the output of the lowpass filter 309 and provides accurate samples (r) of it to the fading component estimator 311, the conjugate component estimator 312, the first desired component determiner 313, and the imbalance estimator 314.

Functionality of the remaining elements 311–315 of the DSP 304 may be more easily understood by defining notation which further details the composition of the sampled filtered quadrature signal (r). The sampled signal may be described by the following equation:

$$r = hD + h\gamma c = h(D + \gamma c)$$

where h is the fading component, D is the originally transmitted, or desired, component, $\gamma$ is the imbalance component, and c is the conjugate component. The term of this equation in parentheses represents the signal at the output of the transmitter prior to transmission over the RF channel. The fading component represents the RF channel fading which effects both parts of the transmitted signal identically. Note that, in a digital communication system, the desired component is an originally transmitted information symbol selected in the transmitter from a predetermined set of information symbols. For example, in a digital system using 16-ary quadrature amplitude modulation (16QAM), a transmitted information symbol may be one of the sixteen possible information symbols.

Upon obtaining the sampled quadrature baseband signal (r), the DSP 304 employs the fading component estimator 311, the conjugate component estimator 312, and the first desired component determiner 313 to respectively provide an estimate of the fading component (h ), an estimate of the conjugate component (c ), and a first determination of the desired component (d ) that estimates the desired component (D) prior to correction for effects of gain, phase, or gain/phase imbalance in the transmitter. A variety of methods may be utilized to estimate the fading component. The known differential detection method derives the channel fading component estimate directly from the received information signal. Another method interleaves pilot symbols with the original information and utilizes interpolation techniques to estimate the fading component from the pilot symbols. This alternative method is described in detail in pending U.S. patent application Ser. No. 07/783,289, entitled "Communication Signal Having A Time Domain Pilot Component" and assigned to Motorola Inc. Thus, no further discussion will be presented except to facilitate an understanding of the present invention.

The first desired component determiner 313 uses the sampled quadrature baseband signal (r) and the fading component estimate (h^) to obtain a first estimate (d^ ) of the desired component. This is accomplished by first multiplying the baseband samples by the complex conjugate of the estimated fading component, that is $$f = r(h^\wedge)^* = (hD + h\gamma c)(h^\wedge)^*$$

where the asterisk indicates complex conjugation. Assuming the estimated fading component is an accurate estimate of the RF channel fading (i.e. $h^\wedge \cong h$), the following approximate expression for f results:

$$f \cong |h|^2 D + (h\gamma c)(h^\wedge)^*$$
$$= \Delta + \nu.$$

As formulated above, the quantity f comprises a scaled information component ($\Delta$), which includes the originally transmitted information, or data symbol, scaled by the magnitude squared of the fading component, plus a scaled distortion component ($\nu$), which includes the distortion component scaled by the complex conjugate of the fading component estimate. Further, assume that the originally transmitted data symbol was selected from a fixed set of discrete values for which a set of decision thresholds has been defined and that the scaled distortion component is a zero mean random process. From this assumption, the first desired component estimate (d^ ) is determined by scaling the set of known decision thresholds by the magnitude squared of the fading component (i.e. $|h|^2$) and using this new, scaled set of thresholds to perform hard decision decoding of the sampler's output signal (r). This preferred method for obtaining the first desired component estimate is further detailed in the previously referenced pending U.S. patent application serial number 07/783,289.

The estimated conjugate component (c^ ) is determined based on the configuration of the communication system. In a communication system which utilizes a single continuous bandwidth to transceive information, the conjugate component estimate is obtained by conjugating the first desired component estimate. That is, $c^\wedge = (d^\wedge)^*$. However, in a multiple subchannel data transmission system, the estimation of the conjugate component is more difficult. A discussion detailing a preferred method for estimating the conjugate component in a four subchannel system is provided below.

Let each of the four subchannels be denoted by the subscript i (i=0, 1, 2, 3) and the first desired component estimates for each subchannel be denoted $d_i^\wedge$. As briefly mentioned above, the transmitter distortion component comprises the conjugate component (c^ ) multiplied by the imbalance component ($\gamma$). As is known, the transmitter distortion component's frequency response is equal to the conjugated, $\gamma$ scaled, frequency-inverted response of the originally transmitted signal. Therefore, in this particular communication system, the estimated conjugate component for subchannel i is obtained as follows:

$$c_i^\wedge = (d_{3-i}^\wedge)^* ; \text{ for } i=0, 1, 2, 3.$$

Thus, the estimated conjugate component of each subchannel i is equal to the conjugated first desired component estimate of its corresponding mirror image subchannel (3-i).

Upon estimating the fading component, the conjugate component, and the first estimate of the desired component, the DSP 304 utilizes the imbalance estimator 314 to estimate the imbalance component ($\gamma$) and to produce a compensated quadrature signal (r') at its output. The imbalance estimator 314 preferably estimates the imbalance component based on an initial value of the imbalance component. This initial value may be derived in a variety of ways. One such way is to assume that the transmitter contains a perfect quadrature modulator. In this case, the initial value of imbalance component would be set to the value of complex zero (i.e. $\gamma^\wedge = 0 + j0$). In an alternative manner, the initial value of the imbalance component may be preset to some typical value, as either determined by a predetermined value stored in memory or by the imbalance estimator 314 after actual operation. A detailed discussion of the operation of the imbalance estimator 314 is provided below.

Figure 4:
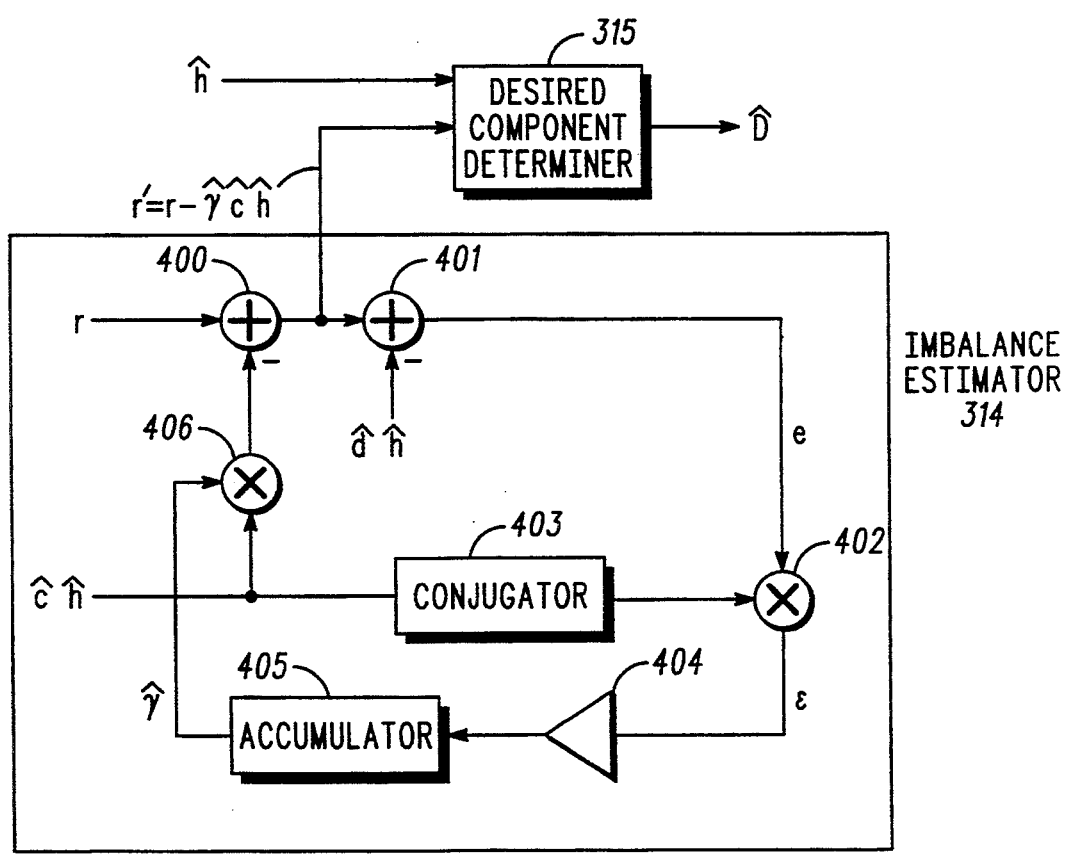
FIG. 4 illustrates operation of an imbalance estimator in accordance with the present invention.

FIG. 4 illustrates operation of a preferred embodiment of the imbalance estimator 314. The sampled quadrature baseband signal (r) enters the imbalance estimator 314 and is applied to a first complex summer 400. In addition, the first complex summer 400 receives a negated output of a first complex multiplier 406. The output of the first complex multiplier 406 is an undesired component (h^ c^ $\gamma$^ ) of the sampled quadrature baseband signal obtained by multiplying the estimated imbalance component by a product of the estimated fading component and the estimated conjugate component. Thus, the first complex summer 400 actually subtracts the undesired component from the sampled quadrature baseband signal to produce the compensated quadrature signal (i.e. r' = r − h^ c^ $\gamma$^ ).

The compensated quadrature signal is supplied to a second complex summer 401 and the desired component determiner 315. The second complex summer 401 also receives the negated product of the first desired component estimate and the estimated fading component. Thus, the output (e) of the second complex summer 401 is produced by subtracting the product of the first desired component estimate and the estimated fading component from the compensated quadrature signal (i.e. $e = r' - d^\wedge h^\wedge$). The output of the second complex summer 401 is provided to an input of a second complex multiplier 402.

The second complex multiplier 402 supplies an error signal ($\epsilon$) to an error amplifier 404 based on its two inputs. As noted above, one input to the second complex multiplier 402 is the output of the second complex summer 401. However, the other input to the second complex multiplier 402 is provided via a conjugator 403 which produces the complex conjugate of the product of the estimated conjugate component and the estimated fading component. Thus, the error signal produced by the second complex multiplier 402 may be written as $\epsilon = e (c^\wedge)^*(h^\wedge)^*$, where the asterisk indicates complex conjugation.

Assuming that all estimates are accurate, excluding the estimate ($\gamma^\wedge$) of the imbalance component, mathematical manipulation of the above error signal equation results in an error signal formulation that is directly proportional to the error between the actual value of the imbalance component and the estimated imbalance component. Thus, $\epsilon = \alpha(\gamma - \gamma^\wedge)$ where $\alpha$ is a positive, real proportionality factor. The error amplifier 404 amplifies the error signal by a constant gain factor, $\kappa$, and provides the amplified error signal to an accumulator 405. The accumulator 405 updates the current value of the estimated imbalance component ($\gamma^\wedge$) to produce an updated imbalance component estimate based on a requirement that $$\gamma^\wedge (n+1) = \gamma^\wedge (n) + \kappa\epsilon,$$

where $\kappa$ is the gain of the error amplifier 404, $\gamma^\wedge (n)$ denotes the estimate of the imbalance component at time n, and $\gamma^\wedge (n+1)$ denotes the updated imbalance component estimate at time n+1. During the first transition through the accumulator 405, the estimate of the imbalance component at time n is set to an initial value as previously discussed with reference to FIG. 3. The updated imbalance component is supplied to an input of the first complex multiplier 406 and is subsequently utilized to produce the compensated quadrature signal (r'). Therefore, the imbalance estimator 314 employs known closed loop feedback techniques to continually determine the error signal with updated estimates of the imbalance component until the magnitude of the error signal is negligible. Upon obtaining a negligible error signal, the imbalance estimator 314 provides an accurate estimate of the compensated quadrature signal to the desired component determiner 315.

The compensated quadrature signal (r') and the estimated fading component ($h^\wedge$) are applied to the desired component determiner 315 which determines the desired component ($D^\wedge$) of the received quadrature modulated signal based on a ratio of the compensated quadrature signal to the estimated fading component. By obtaining the desired component via the present invention, a signal-to-quadrature imbalance noise improvement of 10 dB or greater may be obtained for a 16-ary QAM signal when compared to neglecting the transmitter distortion.

In an alternative embodiment, the closed loop feedback of the imbalance estimator 314 may be replaced with a block approach in which multiple blocks are used to accumulate samples of the quadrature modulated signal and estimates of the first desired component, the conjugate component, and the fading component over a predetermined period of time. In this case, the estimated imbalance component may be expressed as follows:

$$\gamma^\wedge = \{\Sigma[h^\wedge {}^*c^\wedge {}^*(r - d^\wedge h^\wedge)]\} / \{\Sigma(|c^\wedge|^2 |h^\wedge|^2)\}.$$

The numerator and denominator in this imbalance component estimate are derived by summing accumulations of the denoted quantities obtained over the predetermined period of time (e.g. 1 second).

Figure 1:
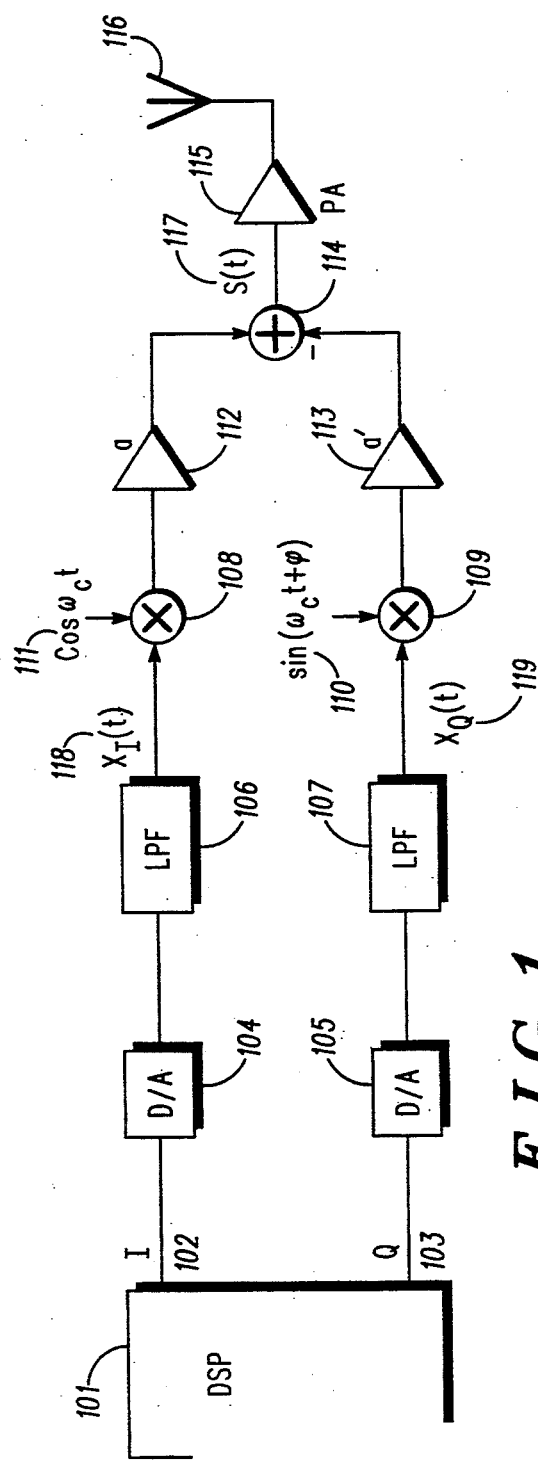
FIG. 1 illustrates a typical prior art transmitter that provides quadrature modulation prior to transmission.
Figure 2:
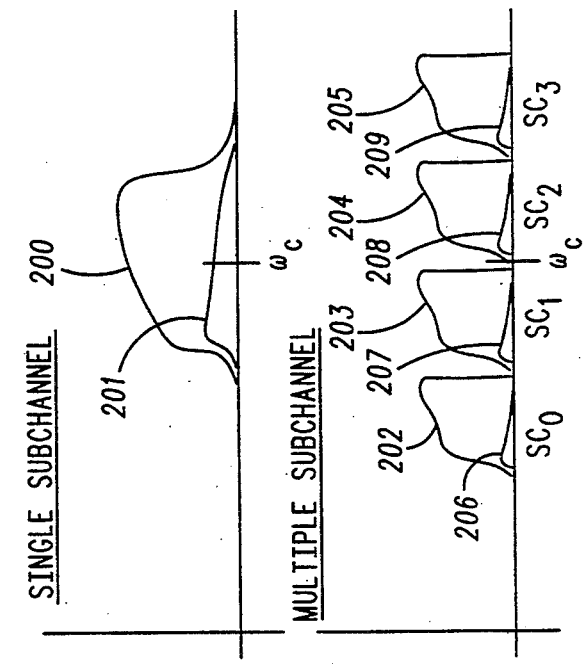
FIG. 2 illustrates cross subchannel interference produced by the typical prior art transmitter.

In a further embodiment, the quadrature modulated signal may also include a pre-established parameter portion, or pilot symbol. The pilot symbols provide a reference from which the RF channel fading can be estimated. As briefly mentioned above with reference to FIG. 1, the pilot symbols may be interleaved with information symbols in the quadrature modulated signal prior to transmission at the transmitter. Since both the receiver and the transmitter contain predetermined knowledge of the pilot symbols, the receiver samples the received quadrature modulated signal during reception of the pilot symbols and provides corresponding estimates of the channel fading imposed on the pilot symbols. Once the channel fading is estimated for the pilot symbols, interpolation techniques are performed on the channel fading estimates to determine the fading produced during transmission of the information symbols. Thus, an accurate estimation of the fading component is obtained by measuring fading effects on known, or pre-established, symbols. As detailed above, an accurate estimation of the fading component is essential in extracting the desired component from the received quadrature modulated signal. A detailed discussion of a preferred method for estimating RF channel fading using time-domain pilot symbols is provided in the previously referenced pending U.S. patent application Ser. No. 07/783,289.

The present invention provides a method for a receiver to minimize effects of transmitter distortion produced by gain, phase, or gain-phase imbalance in received quadrature modulated signals. With this invention, the additional interference produced by modulator imbalances in the transmitter is significantly reduced in the receiver. Thus, the present invention enhances the signal usability of the received quadrature modulated signal. The present invention is critical for higher order modulation schemes, such as 16-ary QAM or 64-ary QAM, since these schemes are particularly susceptible to low levels of interference and distortion. Therefore, by implementing the present invention in communication systems that utilize higher order modulation schemes, a substantial improvement in the signal-to-quadrature imbalance noise power ratio may be attained at the receiver due to the virtual elimination of the distortion inherently produced in quadrature modulators.

We claim:

1. In a receiver that receives quadrature modulated signals, a method for determining desired components of the quadrature modulated signals by minimizing effects of transmitted distortion produced by gain, phase, or gain-phase imbalance in a transmitter that transmitted the quadrature modulated signals, the method comprises the steps of:
  a) receiving a quadrature modulated signal, wherein the quadrature modulated signal includes a desired component, a fading component, and a transmitter distortion component and wherein the transmitter distortion component includes a conjugate component and an imbalance component;
  b) estimating, by the receiver, the fading component to produce an estimated fading component;
  c) estimating, by the receiver, the conjugate component to produce an estimated conjugate component;
  d) estimating, by the receiver, the imbalance component to produce an estimated imbalance component;
  e) determining, by the receiver, the desired component based on the quadrature modulated signal, the estimated fading component, the estimated conjugate component, and the estimated imbalance component.

2. In the method of claim 1, step (d) further comprises the steps of:
  d1) selecting an initial value of the imbalance component;
  d2) estimating a first estimated desired component estimate; and
  d3) estimating the imbalance component based on the quadrature modulated signal, the first estimated desired component, the initial value of the imbalance component, the estimated conjugate component, and the estimated fading component.

3. In the method of claim 1, step (e) further comprises the steps of:
  e1) multiplying the estimated fading component by a product of the estimated conjugate component and the estimated imbalance component to produce an undesired component;
  e2) subtracting the undesired component from the quadrature modulated signal to produce a compensated quadrature signal; and
  e3) determining the desired component based on a ratio of the compensated quadrature signal to the estimated fading component.

4. In the method of claim 1, wherein the quadrature modulated signal includes a pre-established parameter portion, step (b) further comprises estimating the fading component based on predetermined knowledge of the pre-established parameter portion.

5. In the method of claim 2, step (d3) further comprises the steps of:
  d3a) utilizing closed loop feedback to determine an error signal based on the quadrature modulated signal, the first estimated desired component, the initial value of the imbalance component, the estimated conjugate component, and the estimated fading component;
  d3b) estimating the imbalance component based on the initial value of the imbalance component and the error signal to produce an imbalance component estimate;
  d3c) continuing to update the imbalance component estimate, via the closed loop feedback, until the error signal is negligible.

6. In the method of claim 2, step (d3) further comprises estimating the imbalance component based on accumulations of the quadrature modulated signal, the first estimated desired component, the estimated conjugate component, and the estimated fading component over a predetermined period of time.

7. In a receiver that receives quadrature modulated signals, wherein the quadrature modulated signals include at least two subchannel signals, a method for determining desired components of the quadrature modulated signals by minimizing effects of transmitted distortion produced by gain, phase, or gain-phase imbalance in a transmitter that transmitted the quadrature modulated signals, the method comprises the steps of:
  a) receiving a quadrature modulated signal, wherein each subchannel signal of the at least two subchannel signals includes a desired component, a fading component, and a transmitter distortion component and wherein the transmitter distortion component includes a conjugate component and an imbalance component;
  b) estimating, by the receiver, the fading component of the each subchannel signal to produce estimated fading components;
  c) estimating, by the receiver, the conjugate component of the each subchannel signal based on the desired component of a corresponding mirror image subchannel signal of the at least two subchannel signals to produce estimated conjugate components;
  d) estimating, by the receiver, the imbalance component to produce an estimated imbalance component;
  e) determining, by the receiver, the desired component of the each subchannel signal based on the quadrature modulated signal, the estimated fading components, the estimated conjugate components, and the estimated imbalance component.

8. In the method of claim 7, step (d) further comprises the steps of:
  d1) selecting an initial value of the imbalance component;
  d2) estimating the desired component of the each subchannel signal to produce a first estimate of each desired component; and
  d3) estimating the imbalance component based on the quadrature modulated signal, the first estimate of each desired component, the initial value of the imbalance component, the estimated conjugate components, and the estimated fading components.

9. In the method of claim 7, step (e) further comprises the steps of:
  e1) multiplying each of the estimated fading components by a corresponding one of the estimated conjugate components and the estimated imbalance component to produce undesired components;
  e2) subtracting each of the undesired components from the quadrature modulated signal to produce compensated quadrature signals; and
  e3) determining the desired component of the each subchannel signal based on a ratio of each of the compensated quadrature signals to a corresponding one of the estimated fading components.

10. In the method of claim 7, wherein each of the at least two subchannel signals includes a pre-established parameter portion, step (b) further comprises estimating the fading component of the each subchannel signal based on predetermined knowledge of the pre-established parameter portion.

11. In the method of claim 8, step (d3) further comprises the steps of:

d3a) utilizing closed loop feedback to determine an error signal based on the quadrature modulated signal, the first estimate of each desired component, the initial value of the imbalance component, the estimated conjugate components, and the estimated fading components;

d3b) estimating the imbalance component based on the initial value of the imbalance component and the error signal to produce an imbalance component estimate;

d3c) continuing to update the imbalance component estimate, via the closed loop feedback, until the error signal is negligible.

12. In the method of claim 8, step (d3) further comprises estimating the imbalance component based on accumulations of the quadrature modulated signal, the first estimate of each desired component, the estimated conjugate components, and the estimated fading components over a predetermined period of time.

* * * * *